(12) United States Patent
Faig et al.

(10) Patent No.: US 10,735,010 B1
(45) Date of Patent: Aug. 4, 2020

(54) CDR-BASED TIMING SKEW CALIBRATION

(71) Applicant: Mellanox Technologies, Ltd., Yokneam (IL)

(72) Inventors: Hananel Faig, Jerusalem (IL); David Rohlin, Haifa (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 16/575,445

(22) Filed: Sep. 19, 2019

(51) Int. Cl.
   *H03M 1/06* (2006.01)
   *H04L 7/00* (2006.01)

(52) U.S. Cl.
   CPC ........ *H03M 1/0626* (2013.01); *H04L 7/0062* (2013.01)

(58) Field of Classification Search
   CPC .... H03M 1/06; H03M 1/0626; H03M 1/0662; H04L 7/00; H04L 7/25
   USPC .................. 341/118–155; 375/233, 371, 242
   See application file for complete search history.

(56) References Cited

U.S. PATENT DOCUMENTS

| | | | |
|---|---|---|---|
| 7,084,793 B2 | 8/2006 | Elbornsson | |
| 9,806,915 B1* | 10/2017 | Elzeftawi | H04L 25/03885 |
| 10,454,489 B2* | 10/2019 | Ryu | H03M 1/0836 |
| 2006/0232460 A1* | 10/2006 | Huang | H03M 1/1019 |
| | | | 341/155 |
| 2008/0048896 A1* | 2/2008 | Parthasarthy | H03M 1/0836 |
| | | | 341/120 |
| 2008/0048897 A1* | 2/2008 | Parthasarthy | H03M 1/0836 |
| | | | 341/122 |
| 2008/0049825 A1* | 2/2008 | Chen | H04L 25/03057 |
| | | | 375/233 |
| 2008/0049847 A1* | 2/2008 | Telang | H04B 10/25133 |
| | | | 375/242 |
| 2008/0069198 A1* | 3/2008 | Bhoja | H04L 7/0334 |
| | | | 375/233 |
| 2008/0069199 A1* | 3/2008 | Chen | H04L 25/03057 |
| | | | 375/233 |

* cited by examiner

*Primary Examiner* — Lam T Mai
(74) *Attorney, Agent, or Firm* — Kligler & Associates Patent Attorneys Ltd (57) ABSTRACT

In one embodiment, a time-interleaved analog-to-digital convertor (ADC) system, includes an array of ADCs to sample respective analog voltages at sampling times indicated by respective clock signals and to output corresponding digital values, phase generator circuitry to provide multiple, different phase-shifted clock signals for driving the respective sampling times of the ADCs, and a clock and data recovery circuit including ADC-specific first-order loop filters to derive respective ADC-specific average phase error corrections, and a shared loop filter to derive a shared average phase error correction over the array of ADCs and wherein the phase generator circuitry is coupled to provide corrected respective ones of the phase-shifted clock signals responsively to both respective ones of the ADC-specific average phase error corrections derived by respective ones of the first-order loop filters, and the shared average phase error correction derived by the shared loop filter.

14 Claims, 8 Drawing Sheets

CDR-BASED TIMING SKEW CALIBRATION

FIELD OF THE INVENTION

The present invention relates to analog-to-digital convertors, and in particular, but not exclusively to, correction of sampling timing.

BACKGROUND

Analog-to-digital convertors (ADCs) may be used in many devices for example, but not limited to, in a Serializer/Deserializer (SerDes) typically used in high speed communications. The ADC samples an analog signal and outputs a digital signal. In a SerDes, the ADC may be used to improve the signal and determine which symbols were transmitted. In some applications the sampling rate may be very high, and therefore time-interleaved ADC is used, whereby multiple ADCs process different parts of the signal in a time-interleaved fashion to accommodate the very high sampling rate. However, time-interleaved ADC may be used for any sampling rate.

For optimal performance, each of the ADCs in the time-interleaved system samples different symbols in the signal at the same phase of each symbol. For example, each symbol is sampled at its peak. Therefore, the phase difference between adjacent samples should be equal. However, due to various impairments, the phase difference may be unequal. This is known as timing/phase skew or timing/phase mismatch. In some time-interleaved ADCs, each symbol may be sampled at more than one point.

Various systems have attempted to correct this mismatch. For example, US Patent Publication 2006/0232460 of Fong-Ching, et al., describes an apparatus and a method for estimating at least one of timing, gain, and offset errors of a time-interleaved ADC. The apparatus has a first ADC, a second ADC, a converter, an estimator, and a compensator. The converter has a Fourier Transform converter and a calculator.

U.S. Pat. No. 7,084,793 to Elbornsson describes a device that estimates time errors in a time interleaved A/D converter system. To this end an output signal (y1, y2, . . . , yM) is fed to a correction device, that is provided to correct the signals with an estimated time error and to produce M signals (z1, z2, . . . , zM). These signals are used in an estimation algorithm device to estimate the time error and the time estimated time errors are then fed to the correction device.

SUMMARY

There is provided in accordance with an embodiment of the present disclosure, a time-interleaved analog-to-digital convertor system, including an array of analog-to-digital convertors (ADCs), which are configured to receive and sample respective analog voltages at sampling times indicated by respective clock signals and to output corresponding digital values, distribution circuitry, configured to receive and distribute an analog input signal to the ADCs in the array, thereby providing the respective analog voltages to the ADCs, an oscillator configured to generate a master clock signal, phase generator circuitry configured to provide multiple, different phase-shifted clock signals for driving the respective sampling times of the ADCs responsively to the master clock signal, and a clock and data recovery (CDR) circuit including a plurality of ADC-specific first-order loop filters coupled to derive respective ADC-specific average phase error corrections for the ADCs responsively to respective ones of the sampled analog voltages, and a shared loop filter coupled to derive, responsively to ones of the sampled analog voltages, a shared average phase error correction over the array of ADCs, the shared loop filter having an order higher than a first-order, and wherein the phase generator circuitry is coupled to provide corrected respective ones of the phase-shifted clock signals responsively to both respective ones of the ADC-specific average phase error corrections derived by respective ones of the first-order loop filters, and the shared average phase error correction derived by the shared loop filter.

Further in accordance with an embodiment of the present disclosure the phase generator circuitry includes a master phase generator and respective individual phase adjuster circuits for respective ones of the ADCs, the master phase generator is configured to provide the corrected phase-shifted clock signals responsively to the shared average phase error correction derived by the shared loop filter, and the respective individual phase adjuster circuits are configured to further correct the respective corrected phase-shifted clock signals for the respective ADC-specific average phase error corrections derived by the respective first-order loop filters.

Still further in accordance with an embodiment of the present disclosure, the system includes a phase error detector coupled to compute respective phase errors of respective ones of the ADCs responsively to respective ones of the sampled analog voltages, and wherein respective ones of the ADC-specific first-order loop filters are configured to derive the respective ADC-specific average phase error corrections for the ADCs responsively to respective ones of the computed respective phase errors, and the shared loop filter is configured to derive the shared average phase error correction over the array of ADCs responsively to ones of the computed phase errors.

Additionally, in accordance with an embodiment of the present disclosure the phase error detector is configured to compute the respective phase errors based on an algorithm selected from at least one of an early-late algorithm, or a Mueller-Muller algorithm.

Moreover, in accordance with an embodiment of the present disclosure, the system includes a voltage-controlled oscillator (VCO) coupled to compute (a) respective ADC-specific time-domain average phase error corrections for respective ones of the ADCs responsively to the derived respective ADC-specific average phase error corrections, and (b) a shared time-domain average phase error correction responsively to the derived shared average phase error correction, and wherein the phase generator circuitry is coupled to provide the corrected respective phase-shifted clock signals responsively to both the computed respective ADC-specific time-domain average phase error corrections and the computed shared time-domain average phase error correction.

Further in accordance with an embodiment of the present disclosure the VCO includes respective multipliers coupled to compute the respective ADC-specific time-domain average phase error corrections for the respective ADCs.

Still further in accordance with an embodiment of the present disclosure the respective multipliers are configured to multiply the respective ADC-specific average phase error corrections by a multiplier value to yield the respective ADC-specific time-domain average phase error corrections.

Additionally, in accordance with an embodiment of the present disclosure the VCO is configured to compute the multiplier value.

There is also provided in accordance with another embodiment of the present disclosure, a time-interleaved analog-to-digital convertor method, including receiving and sampling, by an array of analog-to-digital convertors (ADCs), respective analog voltages at sampling times indicated by respective clock signals and outputting corresponding digital values, receiving and distributing an analog input signal to the ADCs in the array, thereby providing the respective analog voltages to the ADCs, generating a master clock signal, providing multiple, different phase-shifted clock signals for driving the respective sampling times of the ADCs responsively to the master clock signal, deriving respective ADC-specific average phase error corrections for the ADCs responsively to respective ones of the sampled analog voltages, deriving, responsively to ones of the sampled analog voltages, a shared average phase error correction over the array of ADCs, and providing corrected respective ones of the phase-shifted clock signals responsively to both respective ones of the derived ADC-specific average phase error corrections, and the derived shared average phase error correction.

Moreover, in accordance with an embodiment of the present disclosure, the method includes computing respective phase errors of respective ones of the ADCs responsively to respective ones of the sampled analog voltages, deriving the respective ADC-specific average phase error corrections for the ADCs responsively to respective ones of the computed respective phase errors, and deriving the shared average phase error correction over the array of ADCs responsively to ones of the computed phase errors.

Further in accordance with an embodiment of the present disclosure the computing the respective phase errors is based on an algorithm selected from at least one of an early-late algorithm, or a Mueller-Muller algorithm.

Still further in accordance with an embodiment of the present disclosure, the method includes computing (a) respective ADC-specific time-domain average phase error corrections for respective ones of the ADCs responsively to the derived respective ADC-specific average phase error corrections, and (b) a shared time-domain average phase error correction responsively to the derived shared average phase error correction, and wherein the providing includes providing the corrected respective phase-shifted clock signals responsively to both the computed respective ADC-specific time-domain average phase error corrections and the computed shared time-domain average phase error correction.

Additionally, in accordance with an embodiment of the present disclosure, the method includes multiplying the respective ADC-specific average phase error corrections by a multiplier value to yield the respective ADC-specific time-domain average phase error corrections.

Moreover, in accordance with an embodiment of the present disclosure, the method includes computing the multiplier value.

BRIEF DESCRIPTION OF THE DRAWINGS

The present invention will be understood from the following detailed description, taken in conjunction with the drawings in which.

DESCRIPTION OF EXAMPLE EMBODIMENTS

Overview

As previously mentioned, for optimal performance, each of the analog-to-digital convertors (ADCs) in the time-interleaved system samples different symbols in the signal at the same phase (or phases) of each symbol. Therefore, the phase difference between adjacent samples should be equal. However, due to various impairments, the phase difference may be unequal. This is known as timing/phase skew or timing/phase mismatch.

Embodiments of the present invention provide a time-interleaved analog-to-digital convertor system which corrects for phase mismatch using a clock and data recovery (CDR) circuit. The phase mismatch has two components, a shared component (common to all ADCs) and an individual component (which is ADC specific). The CDR provides a shared phase error correction corresponding to the shared phase error among the ADCs of the time-interleaved system, and ADC-specific phase-error corrections corresponding to the individual error components of the ADCs.

The shared component may be due to: (1) frequency drift (between the frequency of a transmitter and the frequency of a receiver) and (2) jitter. This shared component is common among all the ADCs and can therefore be corrected for in a collective manner. The shared component also tends to change more quickly than the individual component.

The individual component may be due to individual mismatch and/or jitter of each ADC, for example, due to errors in sampling timing of each ADC.

In some embodiments, the time-interleaved analog-to-digital convertor system includes an array of ADCs that receive and sample respective analog voltages at sampling times indicated by respective clock signals and to output corresponding digital values. Distribution circuitry receives and distributes an analog input signal to the ADCs in the array, thereby providing the respective analog voltages to the ADCs. An oscillator generates a master clock signal and phase generator circuitry provides multiple, different phase-shifted clock signals for driving the respective sampling times of the ADCs responsively to the master clock signal. A clock and data recovery (CDR) circuit includes ADC-specific first-order loop filters which derive respective ADC-specific average phase error corrections for the ADCs responsively to respective ones of the sampled analog voltages. The first-order loop may include an adder and a delay. The averaging reduces the effect of one-off behavior, for example, due to noise in the signal. A shared loop filter, included in the CDR, derives, responsively to ones of the sampled analog voltages, a shared average phase (and frequency) error correction over the array of ADCs. The shared loop filter has an order higher than a first-order. For example, the shared loop filter is a second order loop filter or higher.

The individual timing mismatch component is generally a first order effect (e.g., due to a phase error, but no frequency error), thus, a first order loop filter may be used to correct for the individual timing mismatch, although a higher order loop may be used instead. A second order loop filter may be used to also correct for a second order effect (such as a frequency mismatch), which is included in the shared timing mismatch component. Therefore, using the shared loop filter to derive the shared average phase (and frequency) error correction, and the first-order loop filters to derive the ADC-specific average phase error results in a cost-effective implementation as a first order loop filter is generally cheaper to implement than a second order loop filter.

The phase generator circuitry corrects respective ones of the phase-shifted clock signals responsively to both: respective ones of the ADC-specific average phase error corrections derived by respective ones of the first-order loop filters; and the shared average phase error correction derived by the shared loop filter.

In some embodiments, the phase generator circuitry includes a master phase generator and respective individual phase adjuster circuits for respective ones of the ADCs. The master phase generator provides corrected phase-shifted clock signals for the shared average phase error correction derived by the shared loop filter so that each phase-shifted clock signal is corrected by the same amount. The respective individual phase adjuster circuits further correct the corrected respective phase-shifted clock signals for the respective ADC-specific average phase error corrections derived by the respective first-order loop filters. Each individual phase adjuster circuit may use any suitable component(s) to provide the phase correction, for example, but not limited to, using a variable capacitor to provide a delay in the phase-shifted clock signal provided by the master phase generator.

In some embodiments, the CDR includes a phase error detector which computes respective phase errors (in terms of voltage) of respective ADCs responsively to respective ones of the sampled analog voltages received from the ADCs. The phase errors are expressed in terms of an error from a desired phase, which may be the peak of each symbol (or any other suitable phase) in the analog input signal. Respective computed phase errors of the respective ADCs are fed into the respective ADC-specific first-order loop filters. The ADC-specific first-order loop filters derive the respective ADC-specific average phase error corrections for the ADCs responsively to respective ones of the computed respective phase errors. Computed phase errors of all the ADCs are also fed into the shared loop filter which derives the shared average phase error correction over the array of ADCs responsively to ones of the computed phase errors of all the ADCs. The phase error detector computes the phase errors based on any suitable algorithm, for example, but not limited to, early-late algorithm; or Mueller-Muller algorithm.

In some embodiments, the CDR may include a voltage-controlled oscillator (VCO) to compute time-domain average phase error corrections based on the average phase error corrections (which are in terms of voltage not time) derived by the loop filters. The VCO computes (a) respective ADC-specific time-domain average phase error corrections for respective ones of the ADCs responsively to the derived respective ADC-specific average phase error corrections; and (b) a shared time-domain average phase error correction responsively to the derived shared average phase error correction. The VCO may include respective multipliers which compute the respective ADC-specific time-domain average phase error corrections for the respective ADCs and a shared multiplier which computes the shared time-domain average phase error correction. The respective multipliers multiply the respective ADC-specific average phase error corrections by a multiplier value to yield the respective ADC-specific time-domain average phase error corrections. The VCO computes the multiplier value for use by the multiplier. The computation of the multiplier may be computed once on system start-up or intermittently. The VCO typically includes an integrator circuit after each multiplier. The integrator adds the output of the multiplier to a stored value, and outputs the result of the addition operation. The result is also stored as the stored value for future use. The stored value is therefore a cumulative average phase error correction (e.g., a cumulative ADC-specific average phase error correction or a cumulative shared time-domain average phase error correction.

The phase generator circuitry receives the cumulative time-domain error corrections from the VCO and provides corrected respective phase-shifted clock signals responsively to both the computed respective cumulative ADC-specific time-domain average phase error corrections (e.g., using the respective individual phase adjuster circuits) and the computed cumulative shared time-domain average phase error correction (e.g., using the master phase generator).

System Description

Figure 1:
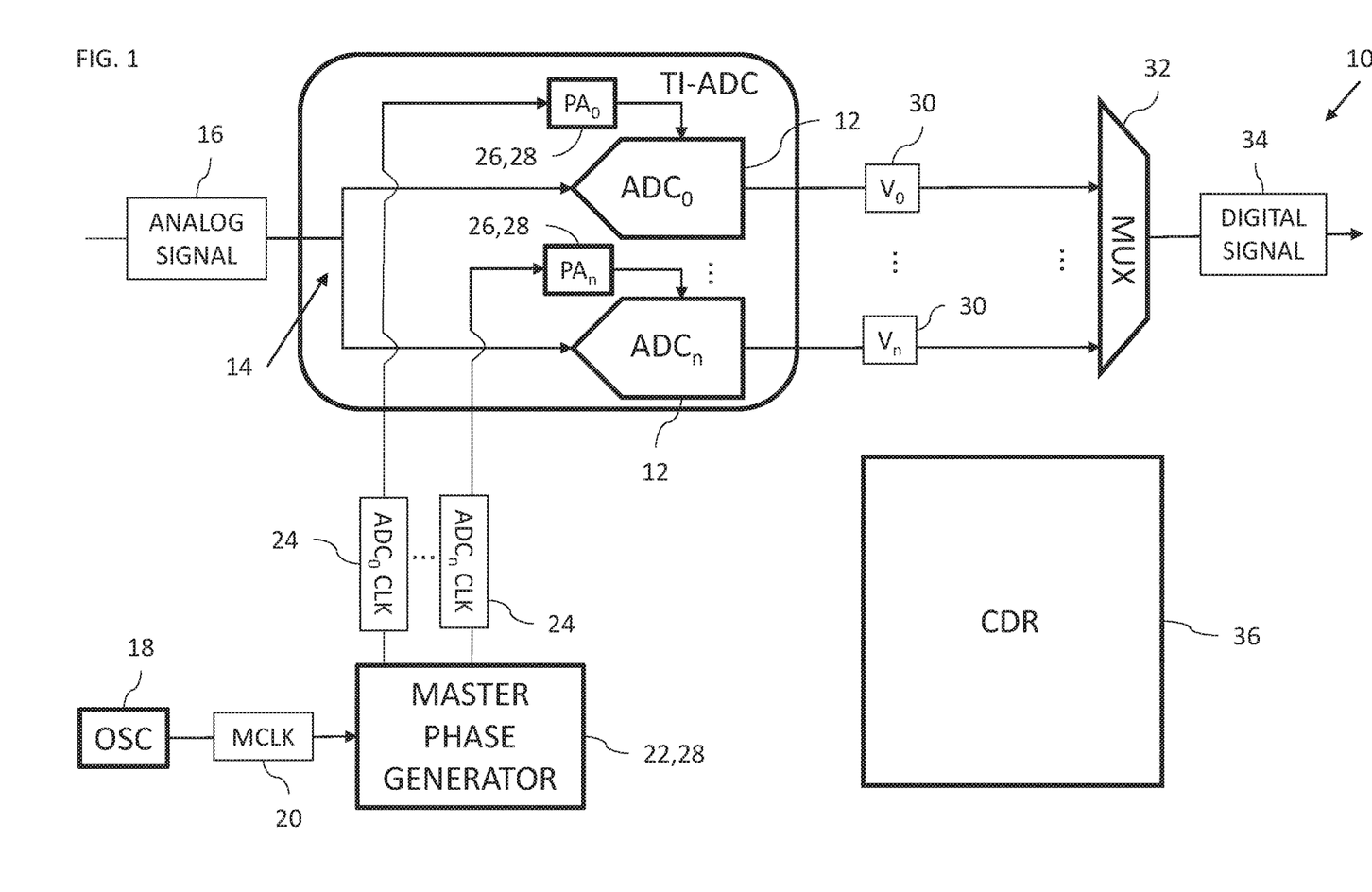
FIG. 1 is a block diagram view of a time-interleaved analog-to-digital convertor system constructed and operative in accordance with an embodiment of the present invention.

Reference is now made to FIG. 1, which is a block diagram view of a time-interleaved analog-to-digital convertor system 10 constructed and operative in accordance with an embodiment of the present invention. The time-interleaved analog-to-digital convertor system 10 includes an array of analog-to-digital convertors (ADCs) 12 (e.g., $ADC_0$ and $ADC_n$) and distribution circuitry 14 configured to receive and distribute an analog input signal 16 to the ADCs 12 in the array, thereby providing respective analog voltages to the ADCs 12. The time-interleaved analog-to-digital convertor system 10 may include any suitable number of ADCs 12. Only two ADCs 12 are shown in FIG. 1 for the sake of simplicity.

The time-interleaved analog-to-digital convertor system 10 includes an oscillator 18 (for example, a crystal oscillator) configured to generate a master clock signal 20 at any suitable frequency. The time-interleaved analog-to-digital convertor system 10 also includes a master phase generator 22 (comprised in phase generator circuitry 28), coupled to the output of the oscillator 18, and configured to provide multiple, different phase-shifted clock signals 24 (e.g., a phase shifted clock for $ADC_0$ and a phase shifted clock for $ADC_n$) for driving respective sampling times of the ADCs 12 responsively to the master clock signal 20. The master phase generator 22 may employ phase division and/or phase interpolation techniques to generate the phase-shifted clock signals 24 or any suitable signal generation technique. The time-interleaved analog-to-digital convertor system 10 includes individual phase adjuster circuits 26 (comprised in the phase generator circuitry 28) with one phase adjuster circuit 26 for each of the ADCs 12. The respective phase-shifted clock signal 24 is input to the respective ADC 12 via the respective phase adjuster circuit 26. For example, the phase-shifted clock signals 24 of $ADC_0$ is fed into the input of the phase adjuster circuit 26 of $ADC_0$. Each individual phase adjuster circuit 26 may comprise a sample and hold circuit (S/H), by way of example only. The phase adjuster circuits 26 are described in more detail with reference to FIGS. 3 and 7.

The ADCs 12 are configured to receive and sample respective analog voltages of the analog input signal 16 at sampling times indicated by the respective phase-shifted clock signals 24 and to output corresponding digital values 30 (e.g., $V_0$ from $ADC_0$ and $V_n$ from $ADC_n$). The time-interleaved analog-to-digital convertor system 10 also includes a multiplexer 32 or any other suitable element to combine the digital values 30 output by the respective ADCs 12 into a digital signal 34.

The system 10 also includes a clock and data recovery (CDR) circuit 36 configured to derive respective ADC-specific average phase error corrections and shared average phase error corrections as will be described in more detail with reference to FIGS. 2-7.

Figure 2:
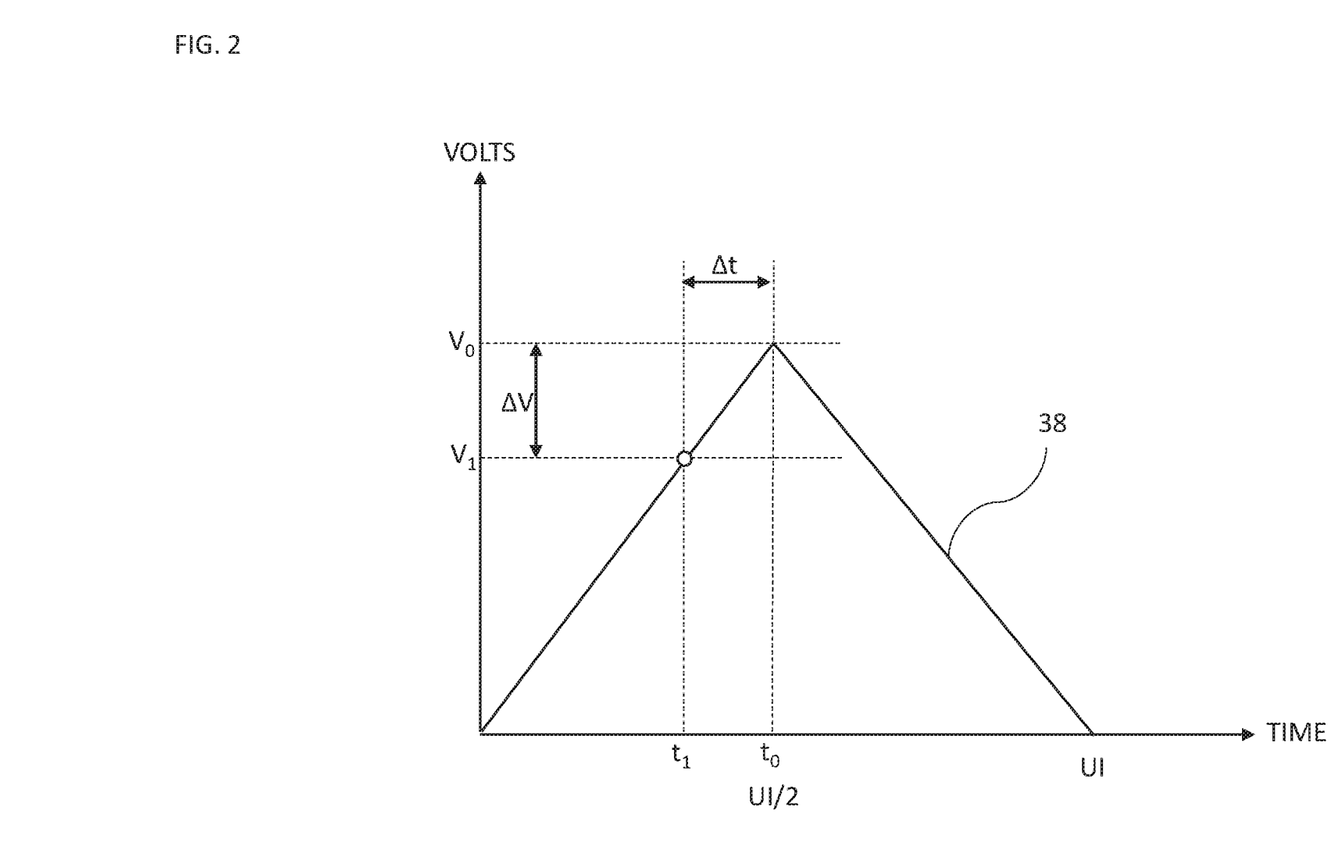
FIG. 2 is a schematic illustration of a sampling phase error for use in the system of FIG. 1.

Reference is now made to FIG. 2, which is a schematic illustration of a sampling phase error for use in the system 10 of FIG. 1. FIG. 2 shows a symbol 38 of the analog input signal 16 of FIG. 1. Assuming that the desired sampling phase is at the peak of the symbol 38, which in this case is equal to half the unit interval (UI) time, the desired sampling time would be at time $t_0$ yielding a sampled voltage $V_0$. However, if there is an error in the sampling time, for example, at time $t_1$ instead of at the desired time of $t_0$, the sampled voltage would be $V_1$ instead of $V_0$. Therefore, the phase error in the time domain, $\Delta t$, from the desired time is equal to $t_0$ less $t_1$. The corresponding phase error in voltage units, $\Delta V$, is equal to $V_0$ less $V_1$. The various sampled voltages of each ADC 12 (FIG. 1) are processed to compute phase errors from a desired phase (which may be the symbol peak, or any other suitable phase of a symbol). The phase errors for any ADC 12 may be computed using any suitable algorithm, for example, but not limited to, early-late (which is generally based on the digital values 30 (FIG. 1) output by the respective ADC 12), or Mueller-Muller algorithm (which is based on the digital values 30 output by the respective ADC 12 and the digital signal 34 (FIG. 1)).

Figure 3:
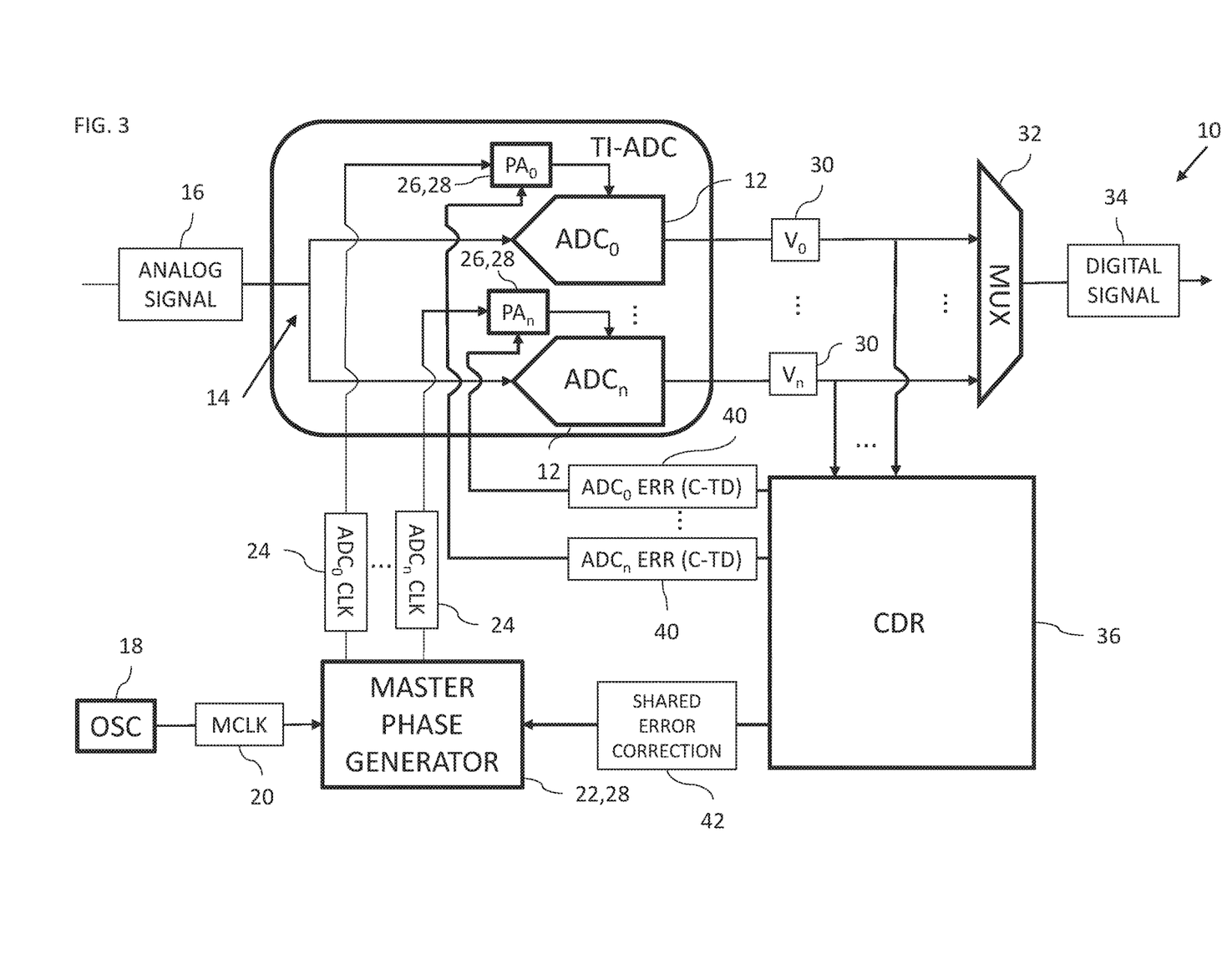
FIG. 3 is a block diagram view of the system of FIG. 1 illustrating phase error correction.

Reference is now made to FIG. 3, which is a block diagram view of the system 10 of FIG. 1 illustrating phase error correction.

The CDR circuit 36 is configured to intermittently compute respective cumulative ADC-specific time-domain average phase error corrections 40 for respective ones of the ADCs 12 responsively to the respective digital values 30, and intermittently compute a cumulative shared time-domain average phase error correction 42 responsively to the digital values 30 of all the ADCs 12. The details of the computation by the CDR circuit 36 is described in more detail with reference to FIG. 4.

The phase generator circuitry 28 is coupled to provide corrected respective phase-shifted clock signals 24 responsively to both the computed respective cumulative ADC-specific time-domain average phase error corrections 40 and the computed cumulative shared time-domain average phase error correction 42.

In some embodiments, the master phase generator 22 is coupled to provide corrected phase-shifted clock signals 24 responsively to the cumulative shared time-domain average phase error correction(s) 42, and the respective phase adjuster circuits 26 are coupled to further correct the respective corrected phase-shifted clock signals 24 responsively to the respective cumulative ADC-specific time-domain average phase error corrections 40. For example, the phase adjuster circuit 26 of $ADC_n$ is coupled to further correct the corrected phase-shifted clock signal 24 of $ADC_n$ responsively to the cumulative ADC-specific time-domain average phase error correction 40 of $ADC_n$.

Figure 4:
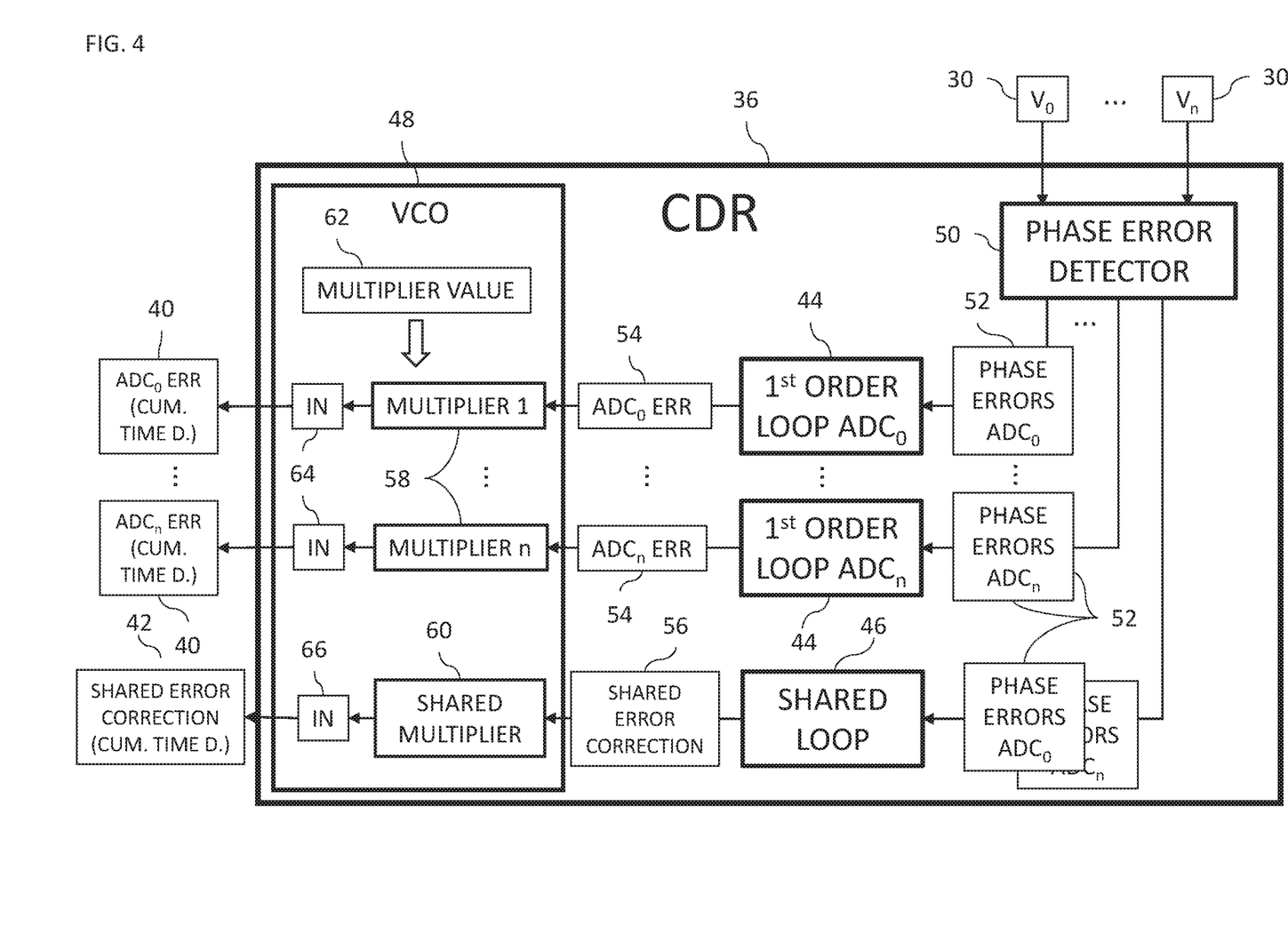
FIG. 4 is a block diagram view of a clock and data recovery (CDR) circuit of the system of FIG. 1 illustrating phase error correction processing.

Reference is now made to FIG. 4, which is a block diagram view of the CDR circuit 36 of the system 10 of FIG. 1 illustrating phase error correction processing. The CDR circuit 36 includes a phase error detector 50, a plurality of ADC-specific first-order loop filters 44, a shared loop filter 46, and a voltage-controlled oscillator (VCO) 48. The CDR circuit 36 includes an ADC-specific first-order loop filters 44 for each of the ADCs 12.

The phase error detector 50 is coupled to compute respective phase errors 52 of respective ones of the ADCs 12 (FIG. 3) responsively to respective ones of the sampled analog voltages of the analog input signal 16 (FIG. 3). For example, the phase error detector 50 is coupled to the output of $ADC_n$ to compute phase errors 52 of $ADC_n$ responsively to the digital values 30 of $ADC_n$, i.e., $V_n$. The phase error detector 50 is configured to compute the respective phase errors based on any suitable algorithm, for example, but not limited to, early-late algorithm; or Mueller-Muller algorithm, described above with reference to FIG. 2.

In practice, some or all of the functions of the phase error detector 50 may be combined in a single physical component or, alternatively, implemented using multiple physical components. These physical components may comprise hard-wired or programmable devices, or a combination of the two. In some embodiments, at least some of the functions of the processing circuitry may be carried out by a programmable processor under the control of suitable software. This software may be downloaded to a device in electronic form, over a network, for example. Alternatively, or additionally, the software may be stored in tangible, non-transitory computer-readable storage media, such as optical, magnetic, or electronic memory.

The outputs of the phase error detector 50 are coupled to the inputs of the ADC-specific first-order loop filters 44 and the shared loop filter 46 so that the respective ADC-specific phase errors 52 are routed to the respective ADC-specific first-order loop filters 44. For example, the phase errors 52 of $ADC_n$ are routed to the ADC-specific first-order loop filter 44 of $ADC_n$, and so on. As the ADCs 12 process the analog input signal 16 in parallel with parallel lanes between the ADCs 12 and the phase error detector 50, the phase error detector 50 knows which digital values 30 stem from which ADCs 12, and therefore, the phase error detector 50 may route the computed ADC-specific phase errors 52 to the respective ADCs 12. It should be noted that there may be one or more lines from each ADC 12 to the phase error detector 50.

The respective ADC-specific first-order loop filters 44 are coupled and configured to derive respective ADC-specific average phase error corrections 54 for the ADCs 12 responsively to respective ones of the computed phase errors 52, which are computed responsively to the digital values 30 (e.g., the sampled analog voltages of the analog input signal 16 (FIG. 3)). For example, the ADC-specific first-order loop filter 44 of $ADC_n$ is configured to derive the ADC-specific average phase error corrections 54 of $ADC_n$ responsively to computed phase errors 52 of $ADC_n$, which are computed responsively to digital values 30 of $ADC_n$. The averaging performed by the ADC-specific first-order loop filters 44 reduces the effect of one-off behavior, for example, due to noise in the analog input signal 16 (FIG. 3). The first-order loops may average any suitable number of phase errors and may depend on characteristics of the signal such as the signal-to-noise ratio (SNR).

The shared loop filter 46 is coupled to the output of the phase error detector 50 to receive the phase errors 52 of all the ADCs 12. The shared loop filter 46 is coupled and configured to derive, responsively to ones of the computed phase errors 52 (of all the ADCs 12), which is computed responsively to ones of the digital values 30 (e.g., the sampled analog voltages of the analog input signal 16), a shared average phase error correction 56 over the array of ADCs 12. The shared loop filter 46 has an order higher than a first-order. For example, the shared loop filter is a second order loop filter or higher.

The VCO 48 is coupled to the outputs of the ADC-specific first-order loop filters 44 and the shared loop filter 46. The VCO 48 is configured to compute the cumulative time-domain average phase error corrections 40, 42 based on the average phase error corrections 54, 56 (which are in terms of voltage not time) derived by the loop filters 44, 46, respectively. The VCO 48 is coupled to compute: (a) the respective cumulative ADC-specific time-domain average phase error corrections 40 for respective ones of the ADCs 12 responsively to the derived respective ADC-specific average phase error corrections 54; and (b) the cumulative shared time-domain average phase error correction(s) 42 responsively to the derived shared average phase error correction(s) 56.

In some embodiments, the VCO 48 is configured to compute a multiplier value 62 used in converting the voltage-based corrections to the time-domain. The VCO 48 also includes respective ADC-specific multipliers 58 coupled to the outputs of the respective ADC-specific first-order loop filters 44 to compute respective ADC-specific time-domain average phase error corrections for the respective ADCs 12. The VCO 48 includes an ADC-specific multiplier 58 for each of the ADC-specific first-order loop filters 44. The respective multipliers 58 are configured to multiply the respective ADC-specific average phase error corrections 54 by the multiplier value 62 to yield the respective ADC-specific time-domain average phase error corrections. For example, MULTIPLIER n is coupled to the output of the ADC-specific first-order loop filter 44 of $ADC_n$ to receive the ADC-specific average phase error corrections 54 of ADC, and compute the ADC-specific time-domain average phase error corrections of $ADC_n$ by multiplying the ADC-specific average phase error corrections 54 of $ADC_n$ by the multiplier value 62. The VCO 48 also includes a shared multiplier 60 coupled to the output of the shared loop filter 46 and configured to compute a shared time-domain average phase error correction by multiplying the shared average phase error correction 56 by the multiplier value 62.

The VCO 48 may include multiple integrators 64 and a shared integrator 66. The output of each ADC-specific multipliers 58 is connected to the input of a respective one of the integrators 64. The output of the shared multiplier 60 is connected to the shared integrator 66. The respective outputs of the integrators 64 (connected to the ADC-specific multipliers 58) are connected to the respective phase adjuster circuits 26 (FIG. 3). The output of the shared integrator 66 is connected to the master phase generator 22 (FIG. 3).

Each integrator 64 adds the output of its associated multiplier 58 to a stored value, and outputs the result of the addition operation to the respective phase adjuster circuit 26. The result is also stored as the stored value for future use. The result and the stored value are equal to the respective cumulative ADC-specific time-domain average phase error correction 40.

The integrator 66 adds the output of shared multiplier 60 to a stored value, and outputs the result of the addition operation to the master phase generator 22. The result is also stored as the stored value for future use. The result and the stored value are equal to the cumulative shared time-domain average phase error correction 42.

An example integrator 64, 66 is described with reference to FIG. 8.

Reference is also made to FIG. 3. The phase generator circuitry 28 is coupled to provide corrected respective ones of the phase-shifted clock signals 24 responsively to both: respective ones of the cumulative ADC-specific time-domain average phase error corrections 40 (which are computed responsively to respective ones of the ADC-specific average phase error corrections 54 derived by respective ones of the ADC-specific first-order loop filters 44), and the cumulative shared time-domain average phase error corrections 42 (which are computed responsively to the shared average phase error correction 56 derived by the shared loop filter 46).

In some embodiments, the master phase generator 22 is configured to provide the corrected phase-shifted clock signals 24 for the shared average phase error corrections 56 derived by the shared loop filter 46. The respective individual phase adjuster circuits 26 are configured to further correct the respective corrected phase-shifted clock signals 24 for the respective ADC-specific average phase error corrections 54 derived by the respective first-order loop filters 44.

Figure 5:
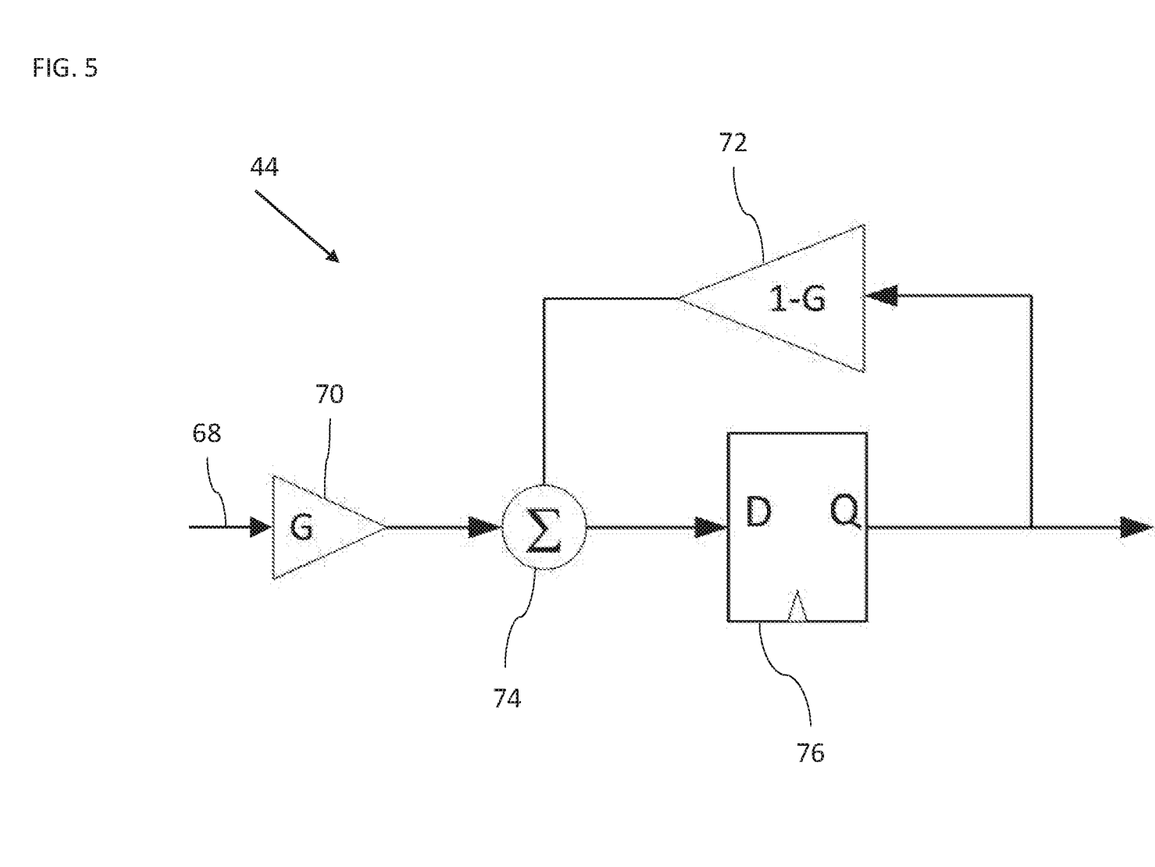
FIG. 5 is a schematic view of a first order loop filter for use in the CDR of FIG. 4.

Reference is now made to FIG. 5, which is a schematic view of an example of one of the ADC-specific first-order loop filters 44 for use in the CDR 36 of FIG. 4. The ADC-specific first-order loop filter 44 includes an input 68, an amplifier 70 with a gain G, an amplifier 72 with a gain 1 minus G, a summer 74 to sum the outputs of the amplifiers 70, 72, a flip-flop 76 which receives the output of the summer 74 and outputs a value to the amplifier 72 and the VCO 48 (FIG. 4). The first-order loop filter described in FIG. 5 is only an example, and any suitable first-order loop filter may be used instead.

Figure 6:
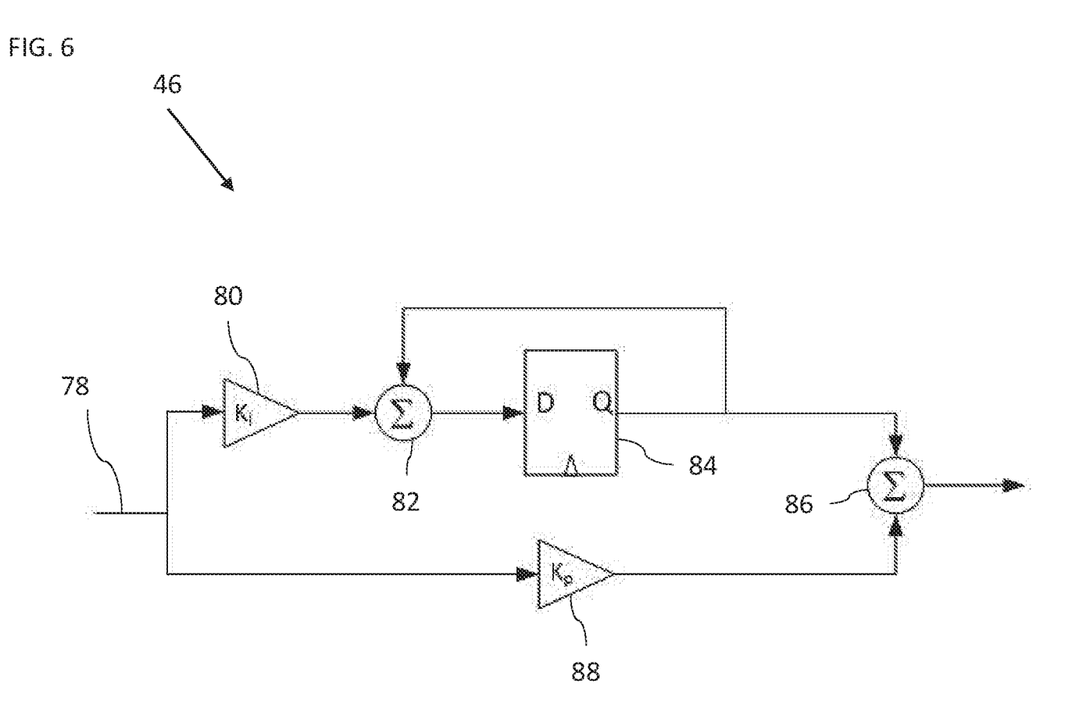
FIG. 6 is a schematic view of a shared loop filter for use in the CDR of FIG. 4.

Reference is now made to FIG. 6, which is a schematic view of an example of the shared loop filter 46 for use in the CDR 36 of FIG. 4. The shared loop filter 46 includes an input 78 which connects with an amplifier 80 with gain $K_i$, which outputs to a summer 82, which in turn outputs to a flip-flop 84. The flip-flop 84 outputs to another summer 86 and also feeds back to the summer 82, which sums the output of the flip-flop 84 and the amplifier 80. The input 78 is also connected to an amplifier 88 of gain $K_p$, which outputs to the summer 86, which sums the output of the flip-flop 84 and the amplifier 88. The output of the summer 86 is connected to the shared multiplier 60 (FIG. 4). The second-order loop filter described in FIG. 6 is only an example, and any suitable second-order loop filter may be used instead.

Figure 7:
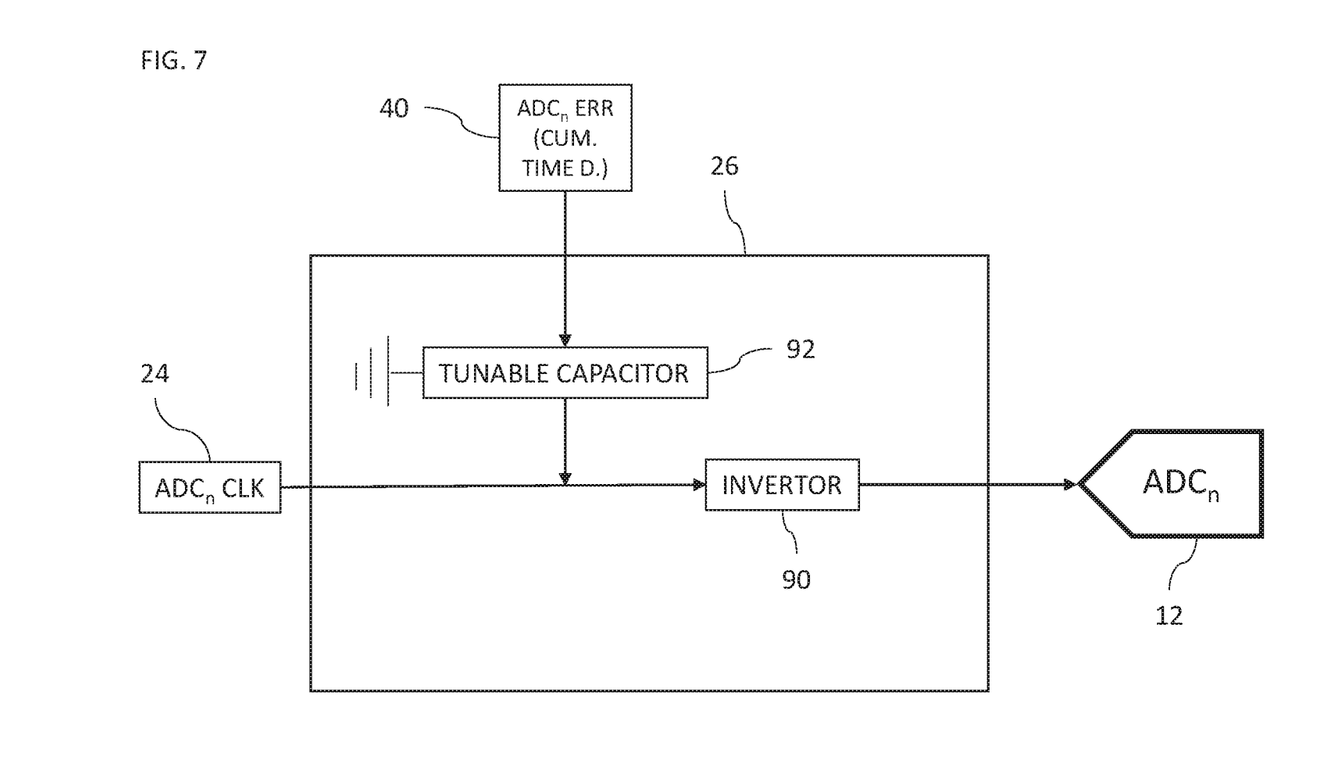
FIG. 7 is a schematic view of a phase adjuster circuit for use in the system of FIG. 1.

Reference is now made to FIG. 7, which is a schematic view of an example of one of the phase adjuster circuits 26 for use in the system of FIG. 1. The phase adjuster circuit 26 includes an invertor 90 and a grounded tunable capacitor 92. The respective phase-shifted clock signal 24 is received in the phase adjuster circuit 26 and is processed by the invertor 90, which may improve the quality of the clock signal for output to the respective ADC 12. The tunable capacitor 92 receives the respective cumulative ADC-specific time-domain average phase error correction 40 and the capacitance of the tunable capacitor 92 is set responsively to the respective cumulative ADC-specific time-domain average phase error correction 40 to incorporate a delay in the phase-shifted clock signal 24 so that the phase of the phase-shifted clock signal 24 is corrected according to the cumulative ADC-specific time-domain average phase error correction 40. The phase adjuster circuit 26 shown in FIG. 7 is given by way of example only, and any suitable phase adjuster circuit 26 may be used.

Figure 8:
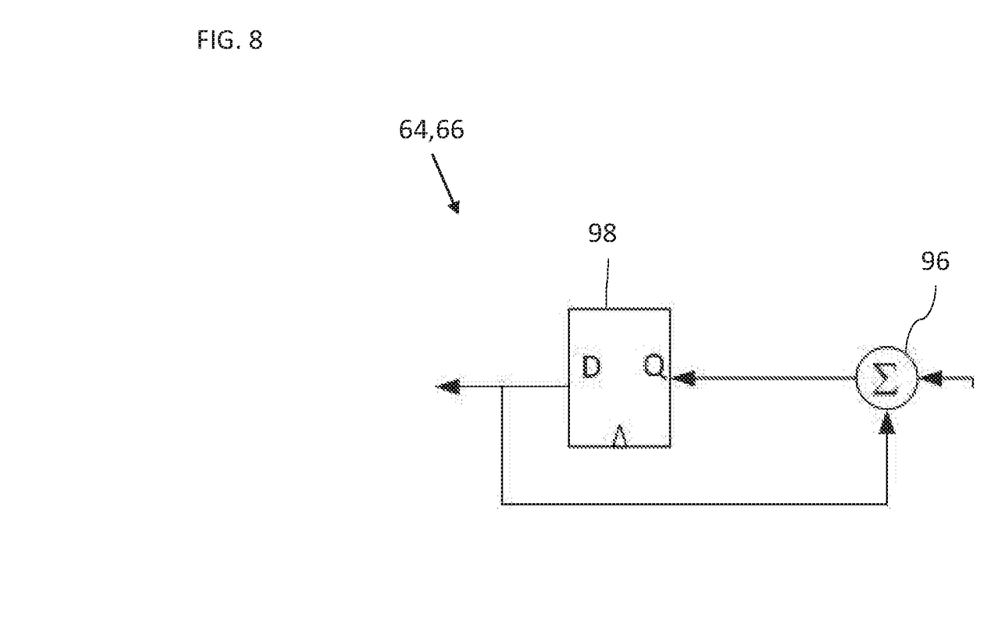
FIG. 8 is a schematic view of an integrator for use in the CDR of FIG. 4.

Reference is now made to FIG. 8, which is a schematic view of an example of the integrator 64, 66 for use in the CDR 36 of FIG. 4. The integrator 64, 66 includes an input 94 which is fed into a summer 96, which in turn is fed into a flip-flop 98. The output of the flip-flop 98 corresponds with the output of the integrator 64, 66. The output of the flip-flop 98 is also fed back to the summer 96, which sums the output of the flip-flop 98 and the input to the integrator 64, 66. The integrator 64, 66 shown in FIG. 8 is given by way of example only, and any suitable integrator 64, 66 may be used.

Various features of the invention which are, for clarity, described in the contexts of separate embodiments may also be provided in combination in a single embodiment. Conversely, various features of the invention which are, for brevity, described in the context of a single embodiment may also be provided separately or in any suitable sub-combination.

The embodiments described above are cited by way of example, and the present invention is not limited by what has been particularly shown and described hereinabove. Rather the scope of the invention includes both combinations and subcombinations of the various features described hereinabove, as well as variations and modifications thereof which would occur to persons skilled in the art upon reading the foregoing description and which are not disclosed in the prior art.

What is claimed is:

1. A time-interleaved analog-to-digital convertor system, comprising:
   an array of analog-to-digital convertors (ADCs), which are configured to receive and sample respective analog voltages at sampling times indicated by respective clock signals and to output corresponding digital values;
   distribution circuitry, configured to receive and distribute an analog input signal to the ADCs in the array, thereby providing the respective analog voltages to the ADCs;
   an oscillator configured to generate a master clock signal;
   phase generator circuitry configured to provide multiple, different phase-shifted clock signals for driving the respective sampling times of the ADCs responsively to the master clock signal; and
   a clock and data recovery (CDR) circuit comprising:
      a plurality of ADC-specific first-order loop filters coupled to derive respective ADC-specific average phase error corrections for the ADCs responsively to respective ones of the sampled analog voltages; and
      a shared loop filter coupled to derive, responsively to ones of the sampled analog voltages, a shared average phase error correction over the array of ADCs, the shared loop filter having an order higher than a first-order, and
   wherein the phase generator circuitry is coupled to provide corrected respective ones of the phase-shifted clock signals responsively to both: respective ones of the ADC-specific average phase error corrections derived by respective ones of the first-order loop filters; and the shared average phase error correction derived by the shared loop filter.

2. The system according to claim 1, wherein:
   the phase generator circuitry comprises a master phase generator and respective individual phase adjuster circuits for respective ones of the ADCs;
   the master phase generator is configured to provide the corrected phase-shifted clock signals responsively to the shared average phase error correction derived by the shared loop filter; and
   the respective individual phase adjuster circuits are configured to further correct the respective corrected phase-shifted clock signals for the respective ADC-specific average phase error corrections derived by the respective first-order loop filters.

3. The system according to claim 1, further comprising a phase error detector coupled to compute respective phase errors of respective ones of the ADCs responsively to respective ones of the sampled analog voltages, and wherein:
   respective ones of the ADC-specific first-order loop filters are configured to derive the respective ADC-specific average phase error corrections for the ADCs responsively to respective ones of the computed respective phase errors; and
   the shared loop filter is configured to derive the shared average phase error correction over the array of ADCs responsively to ones of the computed phase errors.

4. The system according to claim 3, wherein the phase error detector is configured to compute the respective phase errors based on an algorithm selected from at least one of: an early-late algorithm; or a Mueller-Muller algorithm.

5. The system according to claim 1, further comprising a voltage-controlled oscillator (VCO) coupled to compute: (a) respective ADC-specific time-domain average phase error corrections for respective ones of the ADCs responsively to the derived respective ADC-specific average phase error corrections; and (b) a shared time-domain average phase error correction responsively to the derived shared average phase error correction, and wherein the phase generator circuitry is coupled to provide the corrected respective phase-shifted clock signals responsively to both the computed respective ADC-specific time-domain average phase error corrections and the computed shared time-domain average phase error correction.

6. The system according to claim 5, wherein the VCO includes respective multipliers coupled to compute the respective ADC-specific time-domain average phase error corrections for the respective ADCs.

7. The system according to claim 6, wherein the respective multipliers are configured to multiply the respective ADC-specific average phase error corrections by a multiplier value to yield the respective ADC-specific time-domain average phase error corrections.

8. The system according to claim 7, wherein the VCO is configured to compute the multiplier value.

9. A time-interleaved analog-to-digital convertor method, comprising:
   receiving and sampling, by an array of analog-to-digital convertors (ADCs), respective analog voltages at sampling times indicated by respective clock signals and outputting corresponding digital values;
   receiving and distributing an analog input signal to the ADCs in the array, thereby providing the respective analog voltages to the ADCs;
   generating a master clock signal;
   providing multiple, different phase-shifted clock signals for driving the respective sampling times of the ADCs responsively to the master clock signal;
   deriving respective ADC-specific average phase error corrections for the ADCs responsively to respective ones of the sampled analog voltages;

deriving, responsively to ones of the sampled analog voltages, a shared average phase error correction over the array of ADCs; and providing corrected respective ones of the phase-shifted clock signals responsively to both: respective ones of the derived ADC-specific average phase error corrections; and the derived shared average phase error correction.

10. The method according to claim 9, further comprising:

computing respective phase errors of respective ones of the ADCs responsively to respective ones of the sampled analog voltages;

deriving the respective ADC-specific average phase error corrections for the ADCs responsively to respective ones of the computed respective phase errors; and deriving the shared average phase error correction over the array of ADCs responsively to ones of the computed phase errors.

11. The method according to claim 10, wherein the computing the respective phase errors is based on an algorithm selected from at least one of: an early-late algorithm; or a Mueller-Muller algorithm.

12. The method according to claim 9, further comprising computing: (a) respective ADC-specific time-domain average phase error corrections for respective ones of the ADCs responsively to the derived respective ADC-specific average phase error corrections; and (b) a shared time-domain average phase error correction responsively to the derived shared average phase error correction, and wherein the providing includes providing the corrected respective phase-shifted clock signals responsively to both the computed respective ADC-specific time-domain average phase error corrections and the computed shared time-domain average phase error correction.

13. The method according to claim 12, further comprising multiplying the respective ADC-specific average phase error corrections by a multiplier value to yield the respective ADC-specific time-domain average phase error corrections.

14. The method according to claim 13, further comprising computing the multiplier value.

* * * * *